United States Patent [19]
Kuehn et al.

[11] Patent Number: 5,081,000
[45] Date of Patent: Jan. 14, 1992

[54] PHOTOSENSITIVE MIXTURE

[75] Inventors: Eberhard Kuehn, Hemhofen; Albert Hammerschmidt; Erwin Schmidt, both of Erlangen; Hellmut Ahne, Roettenbach, all of Fed. Rep. of Germany

[73] Assignee: Siemens Aktiengesellschaft, Berlin & Munich, Fed. Rep. of Germany

[21] Appl. No.: 494,614

[22] Filed: Mar. 16, 1990

[30] Foreign Application Priority Data

Mar. 20, 1989 [EP] European Pat. Off. ........ 89104948.8

[51] Int. Cl.$^5$ .......................... G03F 7/30; G03F 7/40; G03F 7/039
[52] U.S. Cl. .................................... 430/281; 430/270; 430/282; 430/906; 430/905; 430/910; 430/326; 430/330
[58] Field of Search ............... 430/282, 270, 281, 906, 430/905, 910, 326, 330

[56] References Cited

U.S. PATENT DOCUMENTS

| | | | |
|---|---|---|---|
| 3,647,807 | 3/1972 | Bossert et al. | 260/295.5 |
| 3,773,773 | 11/1973 | Bossert | 260/294.8 D |
| 3,776,735 | 12/1973 | Bauer et al. | 96/115 R |
| 3,803,314 | 4/1974 | Bossert et al. | 424/263 |
| 3,883,543 | 5/1975 | Bossert | 260/295.5 B |
| 3,901,710 | 8/1975 | Ranz et al. | 96/97 |
| 3,946,028 | 3/1976 | Bossert et al. | 260/295.5 R |
| 4,604,340 | 8/1986 | Grossa | 430/270 |
| 4,849,051 | 7/1989 | Ahne et al. | 156/659.1 |

FOREIGN PATENT DOCUMENTS

| | | |
|---|---|---|
| 0300326A1 | 1/1989 | European Pat. Off. |
| 3716629A1 | 12/1988 | Fed. Rep. of Germany |
| 1575281 | 9/1980 | United Kingdom |

OTHER PUBLICATIONS

"Angew. Chem."—Applied Chemistry, vol. 94 (1982), pp. 471-485.
Patent Abstracts of Japan, vol. 8, No. 79 (P. 267) (1516) Apr. 11, 1984 "Positive Type Photosensitive Composition".
Research Disclosure, No. 174, Oct. 1978 "Photosensitive Materials Suited for the Production of Positive Photoresists".
Polymer Engineering and Science, vol. 23, No. 17 (1983) pp. 953-956 "Possibilities for Photoimaging Using Onium Salts".

*Primary Examiner*—Cynthia Hamilton
*Attorney, Agent, or Firm*—Kenyon & Kenyon

[57] ABSTRACT

The invention provides photosensitive mixtures consisting of a polymer and a photoactive component which meet the requirements placed on photoresists. The polymer has carboxylic acid anhydride groups or phenolic hydroxyl groups and the photoactive component is an N-alkylated or N-arylated 1.4-dihydropyridine or a 1.4-dihydropyridine derivative of the following structure:

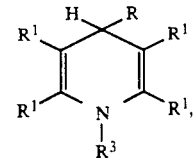

where the R group is a (substituted) aryl group, which, in the ortho position to the bond with the dihydropyridine ring, carries a $NO_2$ group; and $R^3$ is alkyl, cyclohexyl or phenyl.

12 Claims, No Drawings

PHOTOSENSITIVE MIXTURE

FIELD OF THE INVENTION

The invention relates to a photosensitive mixture consisting of a polymer and a photoactive component as well as to a method for producing relief structures from such a photosensitive mixture.

BACKGROUND OF THE INVENTION

Structures within the μm-range which are produced photolithographically from photosensitive mixtures, in other words photoresists, play a key role in the production of highly integrated circuits. These types of structures are generally used as overlay masks for a series of process steps, such as ion implantation, doping, wet and dry etching, that are run through when these structural elements are produced.

While the thermal and mechanical properties of the relief structures as well as the etch resistance can be influenced through the selection of the resin base, that is of the polymer of the resist, the photo-configuring capability is predominantly determined by the photoactive component. Photoactive component and polymer, however, must go well together so that the photosensitive mixture does not separate out and the exposed resist is able to be developed. Moreover, the photoactive component must fulfill a series of requirements, such as good solubility, storage stability, ability to be developed with non-toxic, preferably aqueous, i.e. ecologically safe, developing agents, and high sensitivity, that is a short exposure time, which is associated with a bleaching of the photoactive component. In addition, the adherence of the polymer to the substrate must not be adversely affected and an exact transfer of the pattern must be ensured, which in turn is associated with good resolution.

Either negative resists or positive resists can be used to produce fine structures, (c.f. for example: "Angew. Chem."—Applied Chemistry, vol 94 (1982), pp 471 to 485). Negative resists, where the structuring principle is generally based on a cross-linkage of the exposed parts—which is associated with a lowering of the solubility—have a smaller resolution compared to positive resists as a result of swelling. They are mostly developed with—ecologically and economically unfavorable—organic developing agents. In the case of positive resists, where the solubility is increased through the radiation effect, the difference in solubility between the exposed and unexposed parts is mostly produced as the result of a photochemically induced change of polarity. Through this means—without swelling—an aqueous—alkaline development is made possible.

Positive resists are, for example, systems with o-nitrobenzyl-ester compounds as photoactive components, which when exposed decompose into a polar carboxylic acid and an o-nitrosobenzaldehyde (Applied Chemistry, pp 482). The o-nitrosobenzaldehydes, however, can combine in the resist colored azo compounds and thus counteract a bleaching effect. In systems which work according to the principle of so-called "chemical amplification", protons are produced photolytically. These protons then, for example, saponify phenolic esters to the corresponding phenols. In these systems photoinitiators are used, the so-called Crivello salts, such as triaryl sulfonium salts (c.f. for example: Polym. Eng. Sci., vol. 23 (1983), pp 953 to 956). However, they are very corrosive, so that this stands in the way of any possible application in microelectronics.

The most widely used photoactive component, above all in commercially sold positive resists, is based on sulfonic acid esters of diazo naphthoquinones (Applied Chemistry, pp 481), which combine a good bleaching action with short exposure times. However, these types of systems have a series of disadvantages, such as costly synthesis, that is poor availability, high price, inflammable or explosive characteristics (the latter is true above all of 4-sulfonic acids) and low thermal resistance, that is decomposition; in addition, the thick layers (>30 μm) are not able to be structured.

The object of the invention is to provide a photosensitive mixture consisting of a polymer and a photoactive component which fulfill to a great extent the requirements placed on photoresists and which allow fine structures to be produced.

SUMMARY OF THE INVENTION

The invention provides a photosensitive mixture consisting of a polymer and a photoactive component wherein the polymer has carboxylic acid anhydride groups or phenolic hydroxyl groups and wherein the photoactive component is an N-substituted 1.4-dihydropyridine or a 1.4-dihydropyridine derivative of the following structure:

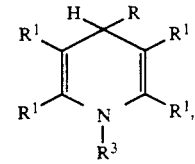

where the $R^1$ groups are the same or different and have the following meaning:

$R^1 = H$, $(CH_2)_n-CH_3$, OH, $O-(CH_2)_n-CH_3$, $(CF_2)_n-CF_3$, $C_6H_5$, $O-C_6H_5$, COOH, $COO-(CH_2)_n-CH_3$, $CO-(CH_{2n}-CH_3$, $(CH_2)_n-O-(CH_2)_m-CH_3$, $(CH_2)_n-OH$, $(CH=CH)_p-CO-CH_3$, F, Cl, Br or J, with m=0 to 10, n=0 to 10 and p=1 to 4, or one of the two pairs of the ortho groups $R^1$ is a constituent of an aromatic or olefinic unsaturated six-membered ring; and the following holds for the R group:

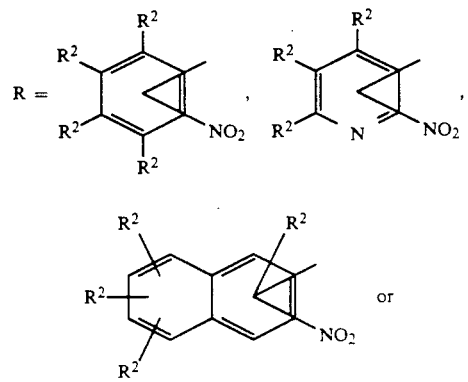

-continued

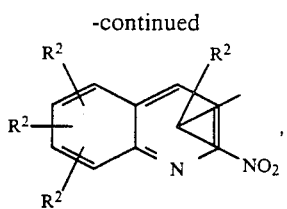

where the NO₂ group is always arranged in ortho position to the bond with the dihydropyridine ring and the R² groups are the same or different and have the following meaning:

$R^2$=H, $(CH_2)_n$—$CH_3$, OH, O—$(CH_2)_n$—$CH_3$, $(CF_2)_n$—$CF_3$, $C_6H_5$, O—$C_6H_5$, COOH, COO—, $(CH_2)_n$—$CH_3$, CO—$(CH_2)_n$—$CH_3$, $(CH_2)_n$—O—$(CH_2)_m$—$CH_3$, $(CH_2)_n$—OH, $NO_2$, F, Cl, Br or I, with m=0 to 10, n=0 to 10; and $R^3$ signifies alkyl with 1 to 7 C-atoms or - possibly substituted -cyclohexyl and phenyl.

DETAILED DESCRIPTION OF THE INVENTION

The photosensitive mixtures according to the invention function either as a positive resist or as a negative resist and are distinguished by a series of outstanding properties. Thus the resist solutions are not only stable in storage, but surprisingly, from the resist solutions, one can also produce layers which can be structured with aqueous-alkaline, possibly amine-containing or ammonia-containing developing agents. Mixtures containing polymers that feature phenolic hydroxyl groups particularly allow for an excellent structuring. These types of photosensitive mixtures function as a negative resist, while mixtures containing polymers that feature carboxylic acid anhydride groups act as a positive resist. The photoresists according to the invention also demonstrate a good, that is a quick and complete bleaching action (at 365 nm), as well as a very good resolution (<1 μm), and they are also able to be structured in thick layers. In addition, due to its simple synthesis, the photoactive component used in these resists can be obtained inexpensively; it is non-toxic and easily soluble, and has good thermal resistance.

The invention makes available a new class of substances for application as a photoactive component in the resist systems, namely substituted N-alkylated or N-arylated 1.4-dihydropyridine (and its derivatives), in particular N-alkylated or N-arylated 4-(2'-nitrophenyl)-1.4-dihydropyridine (and corresponding derivatives) of the following structure:

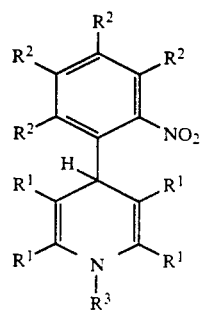

where the $R^1$ and $R^2$ groups are the same or different and the $R^1$, $R^2$ and $R^3$ groups have the meaning set forth above.

N-alkyl-1.4-dihydropyridines that are aryl-substituted in 4- position are known per se (c.f. German Patent 18 13 436 and German Patent 19 23 990, as well as U.S. Pat. No. 3,946,028); they find application in pharmaceuticals. To date, however, no one has reported on the photochemistry of compounds of this type. Nowhere in the art is there even the slightest reference to the possibility of applying these compounds as a photoactive component in photosensitive mixtures.

Polymers with carboxylic acid anhydride groups can be used in the photosensitive mixtures according to the invention. These polymers preferably have the following structure:

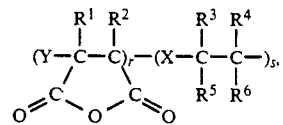

where the following applies: r / r+s=0 to 0.6 and r+s=4 to 3000; X and Y are the same or different and stand for a single bond or for —COO—, —CONH—, —CONHNH—, —OCOO—, —O—, —SO₂—and —COOCO—; the $R^1$, $R^2$, $R^3$, $R^4$, $R^5$ and $R^6$ groups are the same or different and have the following significance: H, $(CH_2)_n$—$CH_3$, $C_6H_5$, COOH, COO—$(CH_2)_n$—$CH_3$, CO—$(CH_2)_n$—$CH_3$, $Si[(CH_2)_n$—$CH_3]_3$, $Si(C_6H_5)_3$, $CH_2$—$Si(CH_3)_3$, $Si(OCH_3)_3$, $C_6H_4$—OH, $C_6H_4$—$(CH_2)_n$—$CH_3$, $C_6H_4$—O—$(CH_2)_n$—$CH_3$ and $(CH_2)_n$—O—$(CH_2)_m$—$CH_3$, with m=0 to 10 and n=0 to 10; $R^1$ and $R^2$ or $R^3$ and $R^4$ or $R^5$ and $R^6$ can also be linked together by cyclic-aliphatic or aromatic means.

The polymers with phenolic hydroxyl groups which can be used in the photosensitive mixtures according to the invention are preferably phenolformaldehyde condensation products of the following structure:

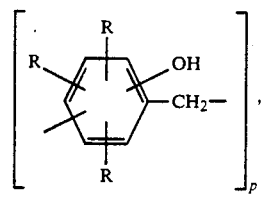

where the following applies:
p=10 to 10,000,
R=H, $(CH_2)_m$—OH, $(CH_2)_n$—$CH_3$, OH, O—$(CH_2)_n$—$CH_3$, $C_6H_5$ or halogen, that is F, Cl, Br and I, with m=1 to 10 and n=0 to 10.

Furthermore, hydroxy polyamides of the following structure can advantageously be used:

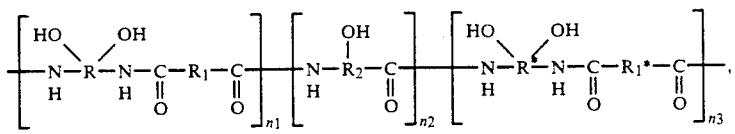

where R, R*, $R_1$, $R^*_1$ and $R_2$ are aromatic groupings and with respect to $n_1$, $n_2$ and $n_3$ the following applies:

$n_1 = 1$ to 100, $n_2$ and $n_3 = 0$, or $n_1$ and $n_2 = 1$ to 100, $n_3 = 0$, or $n_1$, $n_2$ and $n_3 = 1$ to 100 (with $R \neq R^*$ and/or $R_1 \neq R_1^*$), or $n_1$ and $n_3 = 1$ to 100, $n_2 = 0$ (with $R \neq R^*$ and/or $R_1 \neq R_1^*$);

or hydroxy polyimides of the following structure:

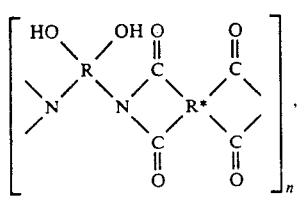

where R and R* are aromatic groupings, which can be the same or different, and the following applies for n: $n = 2$ to 100. Since the concept "aromatic groupings" also comprises heterocycles, such as furan and thiophene, the "phenolic" hydroxyl groups can also sit on these types of groupings.

Hydroxy polyamides of the previously mentioned type are known from DE-OS 37 16 629 and from EP-OS 0 291 779, respectively. Hydroxy polyimides of the previously mentioned type are the subject matter of the European Patent Application No. 88117679.6 dated Oct. 24, 1988 (R and R* thereby have the meaning indicated in both of the previously mentioned publications) as well as in the EP-OS 0 300 326.

In the photosensitive mixtures according to the invention, the mass ratio of the polymer to the photoactive component generally lies between 20:1 and 1:20; preferably this mass ratio lies between 10:1 and 1:10. In addition, polymer mixtures can also be present.

To produce relief structures, a photosensitive mixture according to the invention is deposited in the form of a layer or film on a substrate and is exposed through an overlay mask to actinic light, or it is irradiated by guiding an appropriate light beam. Afterwards, the exposed or irradiated layer or film parts are dissolved out or removed, and the thereby obtained structures are then dried at an elevated temperature and optionally tempered.

The photosensitive mixture, that is the photoresist, can advantageously be deposited, as a solution in an organic solvent, on the substrate. N-methylpyrrolidone or methoxy propyl acetate are thereby preferably used as a solvent. Moreover, other organic solvents with similar properties can be used as well, such as dimethyl formamide and N.N-dimethyl acetamide, as well as mixtures of the named solvents.

An adhesive agent and/or a wetting agent can advantageously be used according to the method of the invention. The adhesive agent and respectively the wetting agent can be mixed with the photoresist solution. Alternatively, they can also be applied to the substrate—before it is coated with the photoresist. The photoresist solution is preferably deposited on the substrate using centrifugal or electrostatic spray techniques. In addition, however, other coating methods such as immersion, brushing and rolling can also be used. The substrate preferably consists of glass, metal (particularly aluminum), plastic or a semi-conductive material.

The invention shall be explained in greater detail with reference to the following exemplified embodiments.

EXAMPLE 1

5 g of a purchasable novolak (Bakelite LG724 CH4), together with 0.5 g N-methyl-3.5-biacetyl-4-(2'-nitrophenyl)-1.4-dihydropyridine (c.f. for preparation "Liebigs Ann. Chem.", vol 670 (1963), pp 57 fol), are dissolved in 20 g N-methylpyrrolidone. The solution that is obtained is deposited through a 0.2 μm filter using a sprayer on to a 3" silicon wafer, which has been treated with a purchasable adhesive agent based on amino silane (KBM 602)—(1100 rpm, 20 s, layer thickness: 1.5 μm). After drying (70° C., 10 min, circulating air), the wafer is exposed through an overlay mask for 20 s (lamp MJB 55 with 42 mW/cm²) and subsequently developed for 90 s with an aqueous-alkaline developing agent (AZ 400K, 1:5.5 diluted with water). Fine structures are obtained (negative image).

EXAMPLE 2

5 g of commercial polyvinyl phenol ($M_W = 9000$ to 11000), together with 1 g N-methyl-2.6-dimethyl-4-(2'-nitrophenyl)-1.4-dihydropyridine-3.5-dicarboxylic acid dimethyl ester (c.f. for preparation DE-PS 19 23 990), are dissolved in 20 g N-methylpyrrolidone. The solution that is obtained is deposited through a 0.2 μm filter using a sprayer on to a 3" silicon wafer, which has been treated with a purchasable adhesive agent based on amino silane (KBM 602)—(1500 rpm, 20 s, layer thickness: 1.44 μm). After drying (70° C., 10 min, circulating air), the wafer is exposed through an overlay mask for 10 s (lamp MJB 55 with 42 mW/cm²) and subsequently developed by immersion for 20 s with an aqueous-alkaline developing agent (AZ 400K, 1:9 diluted with water). Fine, negative relief structures with good contrast are obtained.

EXAMPLE 3

4 g of a polybenzoxazole precursor, prepared from 2.2-di-(3-amino-4-hydroxy phenyl)-1.1.1.3.3.3-hexafluorpropane and 2.2-di-(4-chloro carbonyl phenyl)-1.1.1.3.3.3-hexafluorpropane (c.f. for preparation: "Polym. Letters", vol. 2 (1964), pp 655 fol), together with 1 g N-methyl-3.5-biacetyl-4-(2'-nitrophenyl)-1.4-dihydropyridine (c.f. for preparation "Liebigs Ann. Chem.", vol 670 (1963), pp 57 fol), are dissolved in 20 g N-methylpyrrolidone. The solution that is obtained is deposited through a 0.2 μm filter using a sprayer on to a 3" silicon wafer, which has been treated with a purchasable adhesive agent based on amino silane (KBM 602)—(1000 rpm, 20 s, layer thickness: 1.9 μm). After drying (70° C., 15 min, circulating air), the wafer is exposed through an overlay mask for 20 s (lamp MJB 55 with 42 mW/cm$^2$) and subsequently developed by immersion for 80 s with an aqueous-alkaline developing agent (NMD-3, 0.15%). The layer thereby obtained is tempered in a diffusion oven: 1 h at room temperature up to 170° C., 1 h at 170° to 300° C., 1 h at 300° to 400° C., 1 h at 400° C. and 4 h at 400° C. to room temperature. Fine, highly temperature-resistant, negative relief structures are obtained with a small tempering peak (9%).

EXAMPLE 4

3 g of a styrene/maleic anhydride copolymer (ratio 1:1), together with 1 g N-methyl-2,6-dimethyl-4-(2'-nitrophenyl)-1.4-dihydropyridine-3.5-dicarboxylic acid dimethyl ester (c.f. for preparation DE-PS 19 23 990), are dissolved in 11 g N-methylpyrrolidone. The solution that is obtained is deposited through a 0.2 μm filter on to a 3" silicon wafer, which has been treated with a purchasable adhesive agent based on amino silane (KBM 602)—(1700 rpm, 20 s, layer thickness: 1.4 μm). After drying (70° C., 10 min, circulating air), the wafer is exposed through an overlay mask for 10 s (lamp MJB 55 with 42 mW/cm$^2$). The exposed layer is developed for 75 s with an aqueous-alkaline developing agent (AZ 400K, 1:5 diluted with water, 0.2% NH$_4$OH v/v) and subsequently dried (120° C., 10 min). Fine, positive relief structures are obtained.

We claim:

1. A photosensitive mixture comprising a polymer and a photoactive component, wherein the polymer has carboxylic acid anhydride groups or phenolic hydroxyl groups and wherein the photoactive component is an N-substituted 1.4-dihydropyridine or a 1.4-dihydropyridine derivative of the following structure:

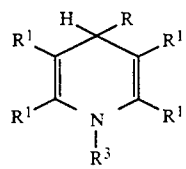

where the R$^1$ groups are the same or different and have the following meaning:

R$^1$=H, (CH$_2$)$_n$—CH$_3$, OH, O-(CH$_2$)$_n$—CH$_3$, (CF$_2$)$_n$—CF$_3$, C$_6$H$_5$, O—C$_6$H$_5$, COOH, COO—(CH$_2$)$_n$—CH$_3$, CO—(CH$_2$)$_n$—CH$_3$, (CH$_2$)$_n$—O—(CH$_2$)$_m$—CH$_3$, (CH$_2$)$_n$—OH, (CH=CH)$_p$—CO—CH$_3$, F, Cl Br or I, with m=0 to 10, n=0 to 10 and p=1 to 4, or one of the two pairs of ortho positioned groups R$^1$ is a constituent of an aromatic or olefinic unsaturated six-membered ring; and the following holds for the R group:

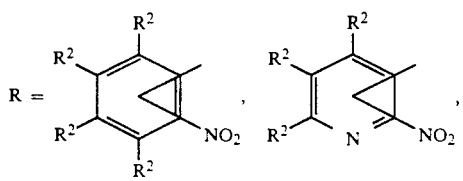

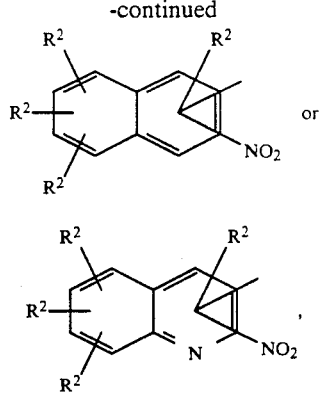

where the NO$_2$ group is always arranged in ortho position to the bond with the dihydropyridine ring and the R$^2$ groups are the same or different and have the following meaning:

R$^2$=H, (CH$_2$)$_n$—CH$_3$, OH, O—(CH$_2$)$_n$—CH$_3$, (CF$_2$)$_n$—CF$_3$, C$_6$H$_5$, O—C$_6$H$_5$, COOH, COO—(CH$_2$)$_n$—CH$_3$, CO—(CH$_2$)$_n$—CH$_3$, (CH$_2$)$_n$—O—(CH$_2$)$_m$—CH$_3$, (CH$_2$)$_n$—OH, NO$_2$, F, Cl, Br or I, with m=0 to 10, n=0 to 10; and R$^3$ signifies alkyl with 1 to 7 C-atoms, cyclohexyl or phenyl.

2. A photosensitive mixture according to claim 1, wherein the photoactive component is an N-substituted 4-(2'-nitrophenyl)-1,4-dihydropyridine or a corresponding derivative of the following structure:

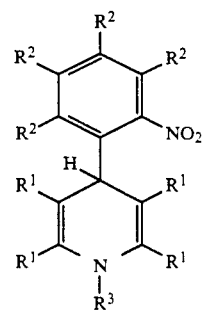

where the R$^1$ and R$^2$ groups are the same or different and the R$^1$, R$^2$ and R$^3$ groups are defined as in claim 1.

3. A photosensitive mixture according to claims 1 or 2 wherein the polymer with carboxylic acid anhydride groups has the following structure:

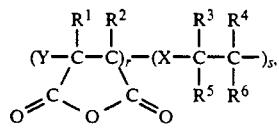

where the following applies:

r / r+s=0 to 0.6 and r+s=4 to 3000;

X and Y are the same or different and stand for a single bond or for —COO—, —CONH—, —CONHNH—, —OCOO—, —O—, —SO$_2$— and —COOCO—;

the R$^1$, R$^2$, R$^3$, R$^4$, R$^5$ and R$^6$ groups are the same or different and are defined as follows:

H, (CH$_2$)$_n$—CH$_3$, C$_6$H$_5$, COOH, COO—(CH$_2$)$_n$—CH$_3$, CO—(CH$_2$)$_n$—CH$_3$, Si[(CH$_2$)$_n$—CH$_3$]$_3$, Si(C$_6$H$_5$)$_3$, CH$_2$—Si(CH$_3$)$_3$, Si(OCH$_3$)$_3$, $C_6H_4$—OH, $C_6H_4$—$(CH_2)_n$—$CH_3$, $C_6H_4$—O—$(CH_2)_n$—$CH_3$ and $(CH_2)_n$—O—$(CH_2)_m$—$CH_3$, with m=0 to 10 and n=0 to 10:

$R^1$ and $R^2$ or $R^3$ and $R^4$ or $R^5$ and $R^6$ can also be linked together by cyclic-aliphatic or aromatic means.

4. A photosensitive mixture according to claims 1 or 2 wherein the polymer with phenolic hydroxyl groups is a phenolformaldehyde condensation product of the following structure:

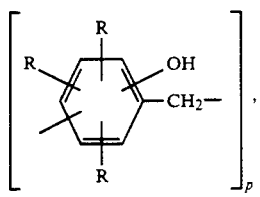

where the following applies: p1 p=10 to 10,000,
R=H, $(CH_2)_m$—OH, $(CH_2)_n$—$CH_3$, OH, O—$(CH_2)_n$—$CH_3$, $C_6H_5$ or halogen,
with m=1 to 10 and n=0 to 10.

5. A photosensitive mixture according to claims 1 or 2 wherein the polymer with phenolic hydroxyl groups is a hydroxy polyamide of the following structure:

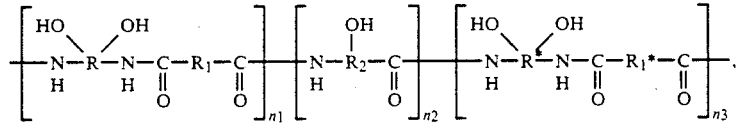

where R, R*, $R_1$, R* and $R_2$ are aromatic groupings and with respect to $n_1$, $n_2$ and $n_3$ the following applies:
$n_1$=1 to 100, $n_2$ and $n_3$=0, or
$n_1$ and $n_2$=1 to 100, $n_3$=0, or
$n_1$, $n_2$ and $n_3$=1 to 100 (with R≠R* and/or $R_1$≠$R_1$*), or $n_1$ and $n_3$=1 to 100, $n_2$=0 (with R≠R• and/or $R_1$≠$R_1$*).

6. A photosensitive mixture according to claims 1 or 2 wherein the polymer with phenolic hydroxyl groups is a hydroxy polyimide of the following structure:

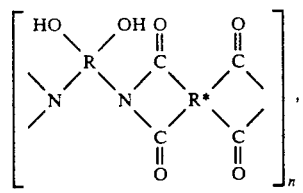

where R and R* are aromatic groupings, which can be the same or different, and n=2 to 100.

7. A photosensitive mixture according to claims 1 or 2 wherein the mass ratio of the polymer to the photoactive component is from 20:1 to 1:20.

8. A photosensitive mixture according to claims 1 or 2 wherein the mass ratio of the polymer to the photoactive component is from 10:1 to 1:10.

9. A method for producing a relief structure comprising the steps of: depositing a photosensitive mixture according to claim 1 in the form of a layer on a substrate; exposing said layer to actinic light through an overlay mask or irradiating said layer by guiding an appropriate light beam; removing the exposed or irradiated layer parts to obtain a relief structure; and drying the resulting relief structure at an elevated temperature.

10. A method according to claim 9 wherein the photosensitive mixture is deposited as a solution in an organic solvent on the substrate.

11. A method according to claim 9 wherein at least one of an adhesive agent and a wetting agent is used in conjunction with the photosensitive mixture.

12. A method according to claim 9 further comprising the step of tempering the dried relief structure.

* * * * *